United States Patent
Lin et al.

(10) Patent No.: US 8,723,275 B2
(45) Date of Patent: May 13, 2014

(54) SEMICONDUCTOR DEVICE WITH METAL SILICIDES HAVING DIFFERENT PHASES

(75) Inventors: Wei-Jung Lin, Taipei (TW); Cheng-Tung Lin, Jhudong Township, Hsinchu County (TW); Chih-Wei Chang, Hsin-Chu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1058 days.

(21) Appl. No.: 12/322,118

(22) Filed: Jan. 27, 2009

(65) Prior Publication Data

US 2009/0166768 A1 Jul. 2, 2009

Related U.S. Application Data

(62) Division of application No. 11/458,503, filed on Jul. 19, 2006, now Pat. No. 7,501,333.

(51) Int. Cl.
*H01L 29/78* (2006.01)

(52) U.S. Cl.
USPC .................... 257/411; 257/412; 257/E29.255

(58) Field of Classification Search
USPC .................. 257/411, 412, E29.255
See application file for complete search history.

(56) References Cited

U.S. PATENT DOCUMENTS

| 4,746,363 | A | 5/1988 | DeAngelis |
| 5,384,485 | A * | 1/1995 | Nishida et al. ................ 257/751 |
| 6,503,833 | B1 | 1/2003 | Ajmera et al. |
| 2006/0084247 | A1 | 4/2006 | Liu |
| 2007/0254479 | A1 | 11/2007 | Fang et al. |

\* cited by examiner

*Primary Examiner* — Thanh V Pham
(74) *Attorney, Agent, or Firm* — Duane Morris LLP

(57) ABSTRACT

A fully silicided gate with a selectable work function includes a gate dielectric over the substrate, a first metal silicide layer over the gate dielectric, and a second metal silicide layer wherein the first metal silicide has a different phase then the second metal silicide layer. The metal silicide layers comprises at least one alloy element. The concentration of the alloy element on the interface between the gate dielectric and the metal silicide layers influence the work function of the gate.

10 Claims, 3 Drawing Sheets

SEMICONDUCTOR DEVICE WITH METAL SILICIDES HAVING DIFFERENT PHASES

RELATED APPLICATION

This application is a divisional application of U.S. patent application Ser. No. 11/458,503, filed on Jul. 19, 2006 now U.S. Pat. No. 7,501,333, the contents of which are hereby incorporated by reference as if set forth in their entirety.

BACKGROUND

The work function of a Ni fully silicide gate or other metal can be tuned by adding alloy element to Ni target for Ni sputter deposition. The work function being the minimum energy needed to remove an electron from the Fermi level in a metal to a point at infinite distance away outside the surface. The work function is generally about half the ionization energy of a free atom of the metal.

The alloy element in Ni silicide is concentrated in the surface after silicide formation. However, the work function of a fully silicide gate is determined at the silicide/dielectric interface or the bottom of the silicide. Therefore, alloy element has little influence on the work function. Though alloy element can be redistributed uniformly in the silicide by high temperature annealing as known in the art, there is not effective way to drive alloy element to the bottom.

In order to enhance the alloy element effects, larger amount of alloy element is added into Ni target. However, when larger amounts of alloy element are added into Ni target, several issues occur, such as a phase separation of the microstructure in the target, which will impact sputter uniformity as well as increasing the possibility of thermal-stress cracking caused by thermal expansion misfits among brittle silicide phases. Also, the maximum amount of element is limited by Ni-alloy mutual solubility. Hence, the work function of a Ni-alloy silicide gate is thus limited.

Often, a different type of metal is desired or a different amount of silicidation is desired in order to create varying work functions dependent upon the device and its characteristics. Thus, there is a need for a silicided structure in which characteristics may be tuned or optimized for a particular application.

SUMMARY

In order to obviate the deficiencies of the prior art, the present subject matter drives the alloy element from the surface to the silicide bottom (or interface) and achieve wide range of alloy concentration and obtain high work function for PMOS or low work function for NMOS. With more alloy element at silicide/dielectric interface, the work function limitation of Ni-alloy silicide for NMOS and PMOS can be surpassed.

It is an object of the present subject matter to present a semiconductor device with a controlled work function. The semiconductor device includes a semiconductor substrate; a gate dielectric over the substrate; and a first metal silicide layer over the gate dielectric. The first metal silicide has a first phase and comprises at least one alloy element. The semiconductor device also includes a second metal silicide layer over the first metal silicide layer. The second metal silicide comprises the same metal as the first metal silicide layer but with a different second phase and also includes at least one alloy element.

It is another object of the present subject matter to present method for adjusting the work function of a FUSI gate. The method including the steps of providing a semiconductor substrate; providing a gate dielectric over the substrate; and depositing a first and second metal silicide layer respectively over the gate dielectric. The first and second metal silicide layers having an alloy element and each having a different phase. The amount of alloy in the first and second metal silicide layers is selected to thereby adjust the work function of the FUSI gate.

These and many other objects and advantages of the present subject matter will be readily apparent to one skilled in the art to which the subject matter pertains form a perusal of the claims, the appended drawings and the following detailed description of the preferred embodiments.

DETAILED DESCRIPTION

Figure 1:
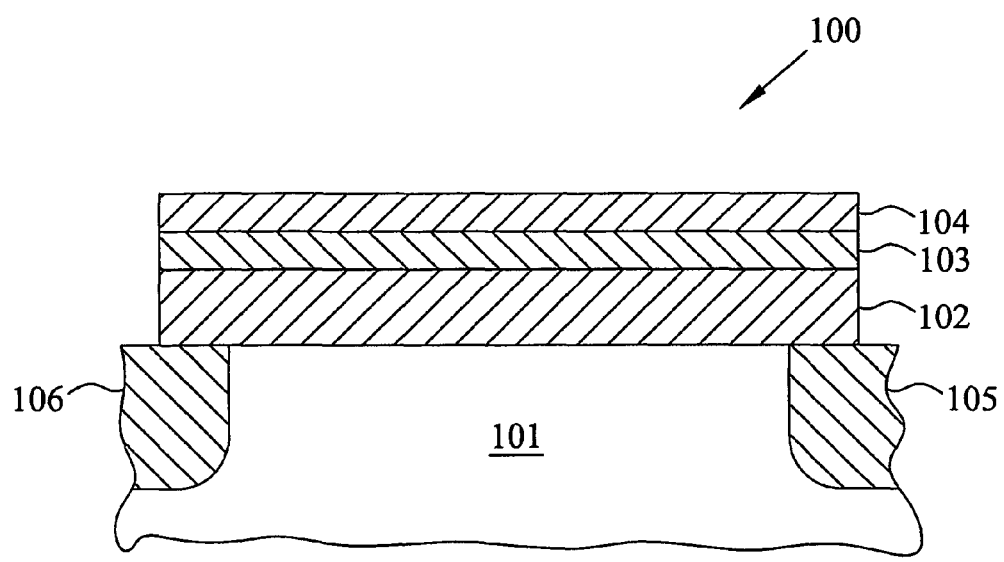
FIG. 1 is an illustration of a FUSI gate according to an embodiment of the present subject matter.

FIG. 1 is an embodiment of a semiconductor device according to the present subject matter. The semiconductor device 100 includes a substrate 101 and a gate dielectric 102. The substrate may be made of Si, SiGe or SOI. The gate dielectric 102 is positioned over the substrate 101 and in the embodiment shown in FIG. 1 over a source 105 and a drain 106. The gate dielectric 102 may be made of Silicon dioxide ($SiO_2$), Silicon oxynitride (SiON), Hafnium Oxide ($HfO_2$), HfSiON, Aluminum Oxide ($Al_2O_3$), Zircon ($ZrSiO_4$) or Zirconium Oxide ($ZrO_2$).

A first metal silicide layer 103 is over the gate dielectric, for example the first metal silicide layer may be of a silicidation metal comprising, for example, Nickel (Ni), Cobalt (Co), Titanium (Ti), Copper (Cu), Zirconium (Zr), Palladium (Pd), Platinum (Pt), Tungsten (W), Ytterbium (Yb), or a combination thereof, but most preferably, comprises nickel or a combination containing nickel. The first metal silicide layer also comprises at least one alloy. The alloy may be comprised or Platinum (Pt), Ytterbium (Yb), Tantalum (Ta), Titanium (Ti), Cobalt (Co), Palladium (Pd), Molybdenum (Mo), Gold (Au), Aluminum (Al), Vanadium (V), Tungsten (W), Niobium (Nb), Zirconium (Zr). The percentage of alloy composition in the first metal silicide layer may range from 1 to 50 percent and the thickness of the first metal silicide layer 103 ranges between and including 10 to 300 angstroms. The selection of the alloy composition percentage affects the modification or tuning of the work function of the FUSI gate as described above. The first metal silicide layer 103 has a first phase, (e.g. NiSi, $Ni_2Si$, or $Ni_3Si$).

A second metal silicide layer 104 is over the first metal silicide layer 103. The second silicide layer 104 may also comprise Ni, Co, Ti, Cu, Zr, Pd, Pt, W or Yb with at least one alloy. The alloy for the second silicide layer 104 may be Pt, Yb, Ta, Ti, Co, Pd, Mo, Au, Al, V, W, Nb, Zr. The percentage of alloy composition in the second metal silicide layer may range from 1 to 10 percent and the thickness of the second metal silicide layer 104 ranges between and includes 100 to 2000 angstroms. The second metal silicide layer 104 has a second phase which is different that the phase of the first metal silicide layer 103 (e.g. if the first metal silicide layer 103 is NiSi, then the second metal silicide layer 104 may be $Ni_2Si$ or $Ni_3Si$.) The thickness of the second metal silicide layer 104 is equal to or larger than the thickness of the first metal silicide layer 103. The second metal silicide layer may comprise the same metal used in the first metal silicide layer or a different metal. When the NiSi layer is thinner, alloy concentration is much higher. The alloy will be pushed out by Ni2Si and pile up into NiSi. Within the ratio of metal deposition thickness to polysilicon thickness 0.95~1.12, a very thin NiSi phase layer can be obtained.

Another aspect of the present subject matter discussed previously is the ability to adjust or tune the work function. This is accomplished by the concentration of the alloy at the interface between the first metal silicide layer and the gate dielectric. By controlling the concentration of the alloy in the metal silicide levels and thus at the interface, the work function of the FUSI gate can be controlled.

Figure 2:
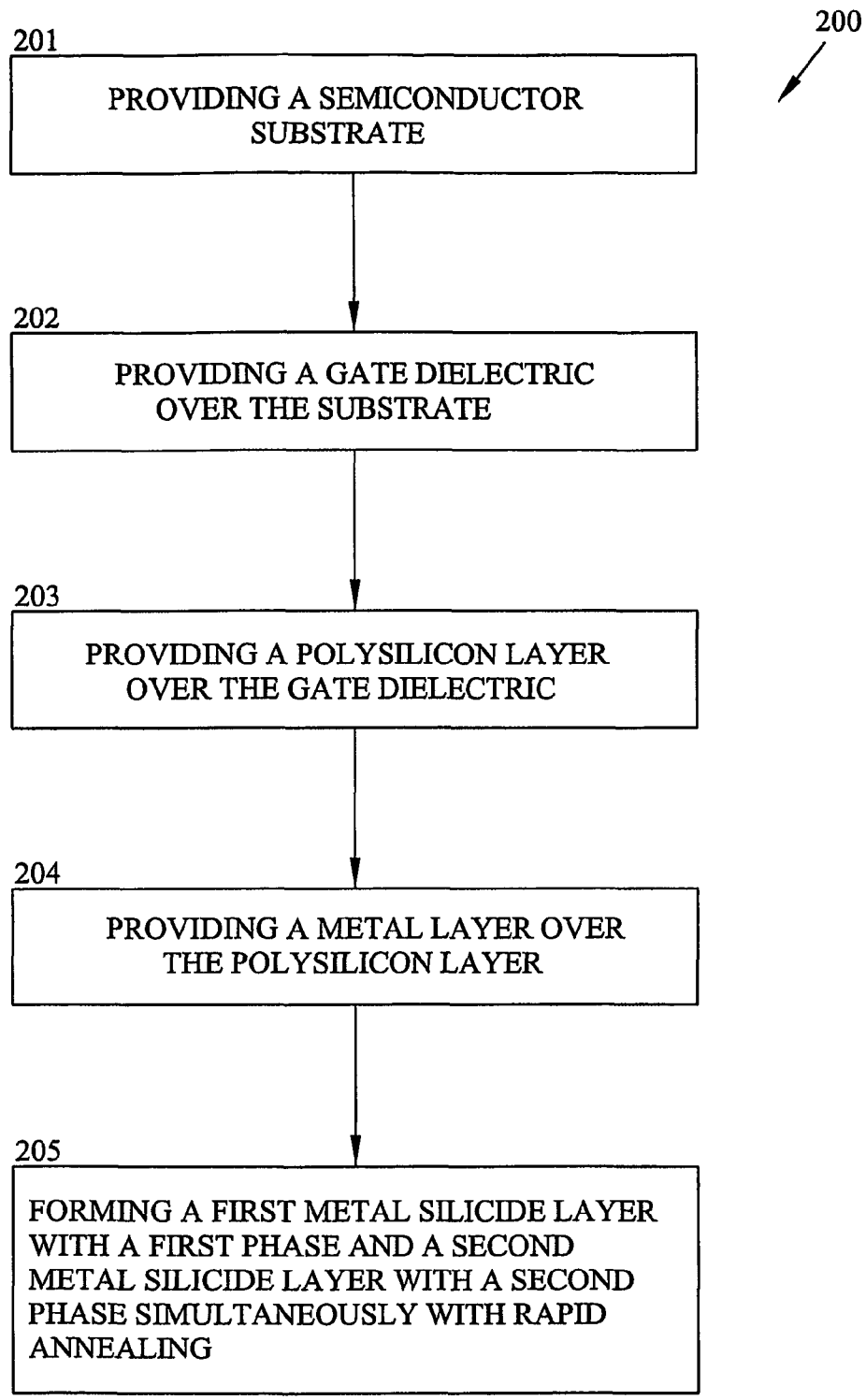
FIG. 2 is a flow chart of a method for adjusting the work function according to an embodiment of the present subject matter.

FIG. 2 is a representative flow chart of a method to adjust the work function of the FUSI gate. A semiconductor substrate is provided as shown in Block 201. A gate dielectric is provided over the substrate in Block 202. A polysilicon layer is provided over the gate dielectric in Block 203. A metal layer is provided over the polysilicon layer in Block 204. A first metal silicide layer with a first phase and a second metal silicide layer with a second different phase are simultaneously formed by the interaction of metal layer and polysilicon layer when applied with rapid thermal annealing in Block 205. The concentration of alloy in the first and second silicide layers is determined by the thickness ratio of metal layer to polysilicon layer and selected to adjust the work function of the FUSI gate.

Figure 3:
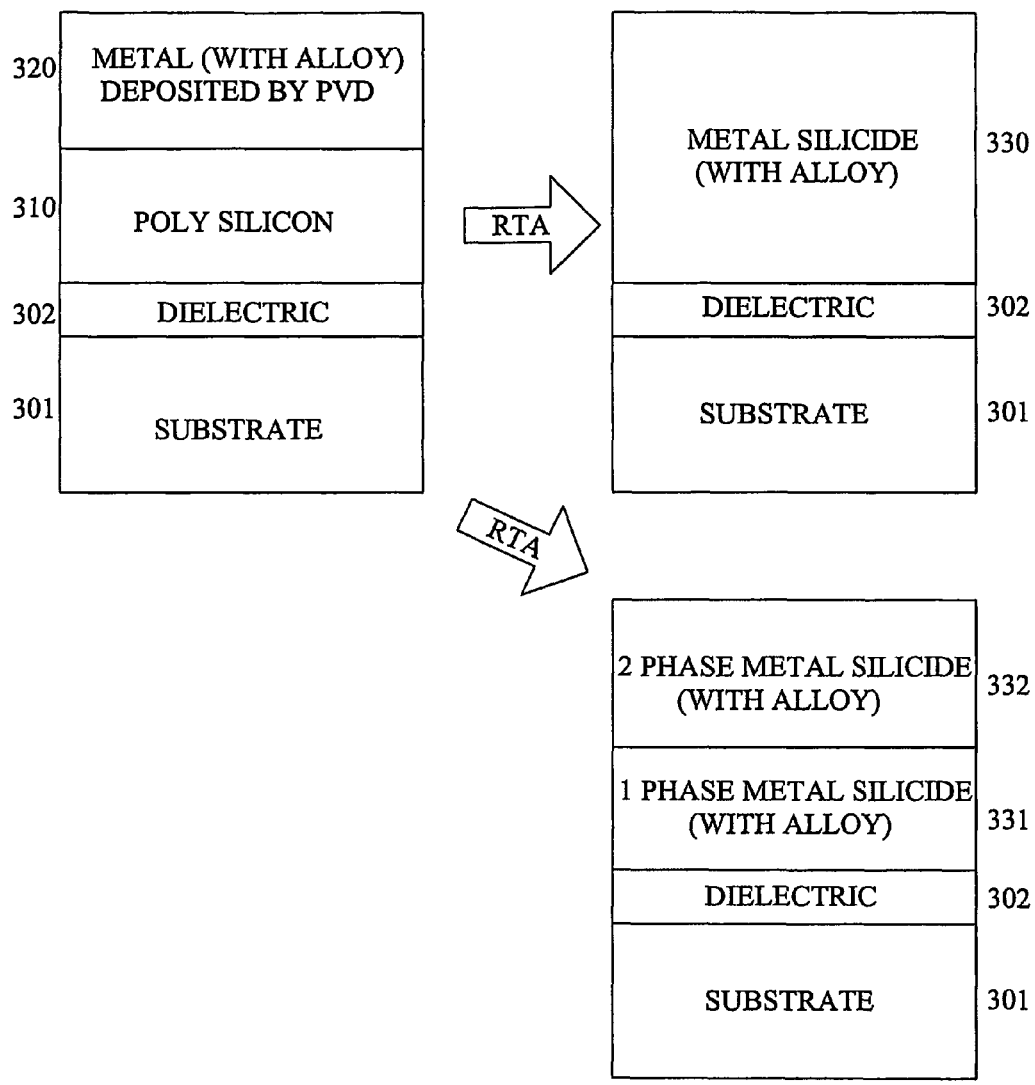
FIG. 3 is an illustration of the method shown in FIG. 2.

FIG. 3 is an illustration of an embodiment of the present subject matter. A polysilicon layer 310 is deposited prior to metal deposition 320, over a dielectric layer 302 and a substrate 301. After metal deposition, for example by physical vapor deposition (PVD) also known as sputtering, the film (the polysilicon layer 310 and the metal layer 320) is applied with rapid thermal annealing (RTA). The metal will react with polysilicon to form metal silicide and thus a metal silicide layer. This metal silicide can be uni-phase 330 or binary phase 332 and 331, due to different nickel to silicon atom ratio controlled by different thickness of metal and polysilicon). For example, when the ratio of total Ni atoms to total silicon atoms is 1, it will form NiSi. And a ratio 2 will obtain Ni2Si. A ratio between 1 and 2 will obtain binary phase, which can be a mixing phase or separate phases.

Experimental results show that substantial increase in the alloy concentration at the interface can be obtained. For example, where 800 A of Ni metal film with a 5% Platinum alloy is deposited on an 800 A polysilicon and annealed at 550 C for 60 seconds resulted in a five fold increase in Platinum concentration at the interface compared with previously known arrangements and methods.

An additional benefit of the present subject matter is the cost optimization enabled by the dual metal silicide layers. The greater concentration of expensive alloy elements is limited to the first metal silicide layer which is only a fraction of the total metal silicide layers. Therefore the material costs are greatly reduced from a single layer in which the alloy concentration is uniform throughout the metal silicide layer.

Under certain RTA and metal to polysilicon thickness ratio, the metal silicide will separate into two layers with different phases. Since the "impurity" (alloy element) solubility in each silicide phase is different, these impurities will be drive from low-solubility phase to high-solubility phase (when applying RTA). For example, the Pt solubility in Ni2Si is lower than in NiSi. Pt was pushed out of Ni2Si into NiSi.

While preferred embodiments of the present subject matter have be described, it is to be understood that the embodiments described are illustrative only and that the scope of the subject matter is to be defined solely by the appended claims when accorded a full range of equivalence, many variations and modifications naturally occurring to those of skill in the art from a perusal hereof.

What we claim is:

1. A semiconductor device comprising:
   a semiconductor substrate;
   a gate dielectric disposed over the substrate;
   a first metal silicide layer disposed over the gate dielectric, wherein the first metal silicide has a first phase; wherein the first metal silicide layer comprises at least one alloy element; and
   a second metal silicide layer disposed over the first metal silicide layer, wherein the second metal silicide has a second phase; wherein the first metal silicide and second metal silicide comprise the same metal and the first and second phases are different.

2. The semiconductor device according to claim 1, wherein the semiconductor substrate comprises a material from the group consisting of Si, SiGe, and SOI.

3. The semiconductor device according to claim 1, wherein the gate dielectric comprises a material selected from the group consisting of $SiO_2$, SiON, $HfO_2$, HfSiON, $Al_2O_3$, $ZrSiO_4$ and $ZrO_2$.

4. The semiconductor device according to claim 1, wherein the metal is selected from the group consisting of Ni, Co, Ti, Cu, Zr, Pd, Pt, W, and Yb.

5. The semiconductor device according to claim 4, wherein the alloy element is selected from the group consisting of Pt, Yb, Ta, Ti, Co, Pd, Mo, Au, Al, V, W, Nb, and Zr.

6. The semiconductor device according to claim 4, wherein the first metal silicide layer has a thickness approximately 10 A to 300 A.

7. The semiconductor device according to claim 4, wherein the composition of the alloy element of the first metal silicide layer is approximately 1% to 50%.

8. The semiconductor device according to claim 4, wherein the metal silicide layer has a thickness t, where $100 Å \leq t \leq 2000 Å$.

9. The semiconductor device according to claim 4, wherein the second metal silicide layer is thicker than the first metal silicide layer.

10. The semiconductor device according to claim 4, wherein the composition of the alloy element of the second metal silicide layer is approximately 1% to 10%.

* * * * *